(12) United States Patent
Hayashi

(10) Patent No.: US 6,573,804 B2
(45) Date of Patent: Jun. 3, 2003

(54) ELECTRONIC APPARATUS HAVING A PRINTED CIRCUIT BOARD WITH MULTI-POINT GROUNDING

(75) Inventor: Seiji Hayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/804,265

(22) Filed: Mar. 13, 2001

(65) Prior Publication Data

US 2001/0043197 A1 Nov. 22, 2001

(30) Foreign Application Priority Data

Mar. 14, 2000 (JP) ........................................ 2000-069876
Mar. 14, 2000 (JP) ........................................ 2000-069877

(51) Int. Cl.[7] ................................................ H03H 7/38
(52) U.S. Cl. ........................... 333/32; 333/12; 361/799; 361/803
(58) Field of Search ........................... 333/32, 33, 246, 333/247; 361/789, 794, 799, 800, 803, 816, 818

(56) References Cited

U.S. PATENT DOCUMENTS 6,046,653 A * 4/2000 Yamada ................... 333/247 X
6,172,881 B1 * 1/2001 Hirai ........................... 361/816

FOREIGN PATENT DOCUMENTS

| JP | 5-27697 | 2/1993 |
| JP | 7-225634 | 8/1995 |
| JP | 8-64984 | 3/1996 |
| JP | 411259172 A | * 9/1999 |

* cited by examiner

Primary Examiner—Benny Lee
Assistant Examiner—Stephen E. Jones
(74) Attorney, Agent, or Firm—Fitzpatrick, Cella, Harper & Scinto

(57) ABSTRACT

An electronic apparatus comprises a conductive device frame, a signal transmitting print wiring plate arranged on said conductive device frame, incorporating a digital clock circuit and having a ground conductive member, a signal receiving print wiring plate arranged on said conductive device frame, incorporating a digital clock circuit and having a ground conductive member, a cable including a signal wire and a ground wire for a signal transmission and electrically connecting said signal transmitting print wiring plate to said signal receiving print wiring plate on said conductive device frame and an impedance element electrically connecting an arbitrary single point on the ground conductive member of said signal receiving print wiring plate to said conductive device frame, wherein said impedance element has circuit parameters equivalent to impedance characteristics between said cable ground wire and said conductive device frame.

4 Claims, 8 Drawing Sheets

ELECTRONIC APPARATUS HAVING A PRINTED CIRCUIT BOARD WITH MULTI-POINT GROUNDING

BACKGROUND OF THE INVENTION

1. Field of the Invention

The present invention relates to an electronic apparatus comprising a signal transmitting print wiring plate and a signal receiving print wiring plate each incorporating a digital clock circuit and having a ground conductive member connected to each other on a conductive device frame through a cable including a signal wire and a ground wire for a signal transmission.

2. Related Background Art

Conventionally print wiring plates have been used for various types of electronic apparatuses such as a still camera, a video camera, and other electric devices. In a configuration in which a print wiring plate is mounted on an electronic apparatus, there are suggested various technologies for reducing noise.

For example, there are disclosed technologies in which a ground of a print wiring plate and a conductive device frame are grounded with resistances in Japanese Patent Application Laid-Open No. 8-64984 and Japanese Patent Application Laid-Open No. 7-225634. These conventional technologies in which the ground of print wiring plate and the conductive device frame are grounded with resistances are suggested to suppress radiated noise caused by a standing wave generated on a substrate.

Recently, however, an electronic apparatus rather rarely has a configuration in which only a single print wiring plate is mounted in the device frame and mostly it has a plurality of print wiring plates connected with each other through a cable. In other words, in recent years, due to advanced functions of various electronic apparatuses as described above and complicated electronic circuits being mounted, there are plenty of configurations in which a print wiring plate is divided into a plurality of units and they are connected through cables for a signal transmission.

Practically the configuration in which the cables are connected to the print wiring plates is far susceptible to a problem of unnecessary noise radiation (EMI: Electro magnetic interference) in comparison with a configuration in which a single print wiring plate is provided in a frame. In such a case, the main noise radiation source is often a cable.

On the other hand in an electronic apparatus having the above configuration, if each connected print wiring plate has different impedance characteristics from those of each cable signal line, a reflection of an electric signal occurs due to a mismatch of the impedance characteristics, thus causing a radiated noise generation or a disorder of a signal waveform.

To solve this problem, conventionally there have been suggested various technologies. For example, there is disclosed a configuration in which radiated noise is reduced by matching impedance characteristics of a signal line of a cable, load impedance of a transistor, and receiving terminal impedance of a substrate with each other in Japanese Patent Application Laid-Open No. 5-27697. This technology is used for reducing radiated noise by means of matching with impedance of a signal line.

In a configuration in which two print wiring plates are connected through a cable on a conductive frame for a signal transmission, however, current flowing through the ground wire may become a main cause of radiated noise rather than current flowing through a signal line.

While the characteristics of current flowing through the ground wire depend upon the impedance characteristics determined by a relationship between the ground wire and the frame, normally a ground conductive member of a print wiring plate is extremely different in shape from a ground conductive member of a cable and therefore the impedance characteristics between the print wiring plate and the cable are significantly different from each other, by which a junction between the print wiring plate and the cable becomes a mismatch point of the impedance characteristics, thereby reflecting the current flowing through the ground conductive member and then a resonance peak of the radiated noise caused by the reflection may lead to a problem on standards or on practical use.

SUMMARY OF THE INVENTION

Therefore it is a first object of the present invention to provide an electronic apparatus which solves the above problems of the prior art and reduces radiation from a cable mainly causing the radiation of radiated noise.

It is a second object of the present invention to provide an electronic apparatus which reduces radiated noise generated by a reflection of signal current flowing through a ground conductive member of a cable at a conductive junction between a print wiring plate and the cable which is a mismatch point of impedance characteristics.

According to a first aspect, the present invention which achieves the first object related to an electronic apparatus, comprising: a conductive device frame, a signal transmitting print wiring plate incorporating a digital clock circuit and having a ground conductive member, a signal receiving print wiring plate incorporating a digital clock circuit and having a ground conductive member, a cable including a signal wire and a ground wire for a signal transmission and electrically connecting the signal transmitting print wiring plate to the signal receiving print wiring plate on the conductive device frame, and an impedance element electrically connecting an arbitrary point on the ground conductive member on the signal receiving print wiring plate to the conductive device frame.

In the above arrangement, the impedance element has circuit parameters equivalent to the impedance characteristics between the ground wire of the cable and the conductive device frame.

In the first aspect of the invention, there can be further arranged a low-impedance element electrically connecting the ground conductive member of the signal transmitting print wiring plate to the conductive device frame.

In the above first aspect of the invention, it is preferable to have an arrangement such that a point on the ground conductive member of the signal receiving print wiring plate connected with the conductive device frame by the impedance element is located in the vicinity of a connection point between the receiver print wiring plate and the cable. The above cable comprises, for example, a coaxial cable.

According to a second aspect, the present invention which achieves the second object related an electronic apparatus, comprising: a conductive device frame, a signal transmitting print wiring plate being mounted on the conductive device frame, incorporating a digital clock circuit, and having a signal conductive member and a ground conductive member, a signal receiving print wiring plate being mounted on the conductive device frame, incorporating a digital clock circuit, and having a signal conductive member and a ground conductive member, and a cable including a signal conductive member for a signal transmission and a ground conductive member and electrically connecting the signal transmitting print wiring plate to the signal receiving print wiring plate on the conductive device frame.

In the above arrangement, the impedance of the signal conductive member and the ground conductive member of the cable depending upon a correlation with the conductive device frame is balanced with the cable-side impedance of the signal conductive member and the ground conductive member of the signal receiving print wiring plate depending upon a correlation with the conductive device frame.

This arrangement enables the electronic apparatus according to the second aspect of the invention to suppress signal reflections at the junctions between the signal conductive member and the ground conductive member of the cable and respective signal conductive members and ground conductive members of the signal transmitting print wiring plate and the signal receiving print wiring plate, thus reducing the radiated noise caused by the signal reflections.

In the electronic apparatus according to the second aspect of the invention, the impedance can be balanced by, for example, utilizing a distance from the conductive device frame to the signal conductive member and the ground conductive member of the cable which is different from a distance from the conductive device frame to the respective signal conductive members and ground conductive members of the signal transmitting print wiring plate and the signal receiving print wiring plate.

Additionally as means for the impedance balance, a high dielectric constant member can be inserted between the cable and the conductive device frame.

Furthermore in the electronic apparatus according to the second aspect, the arrangement may be such that the impedance of the ground conductive member of the cable is balanced with the cable-side impedance of the respective ground conductive members of the transmitter print wiring plate and the receiver print wiring plate and that the impedance of the signal conductive member of the cable is balanced with the cable-side impedance of the respective signal conductive members of the transmitter print wiring plate and the receiver print wiring plate.

In the second aspect, the cable may comprise a cable including a signal conductive member and a cable including a ground conductive member. Furthermore, a coaxial cable can also be used as a cable.

DETAILED DESCRIPTION OF THE PREFERRED EMBODIMENTS

Figure 1:
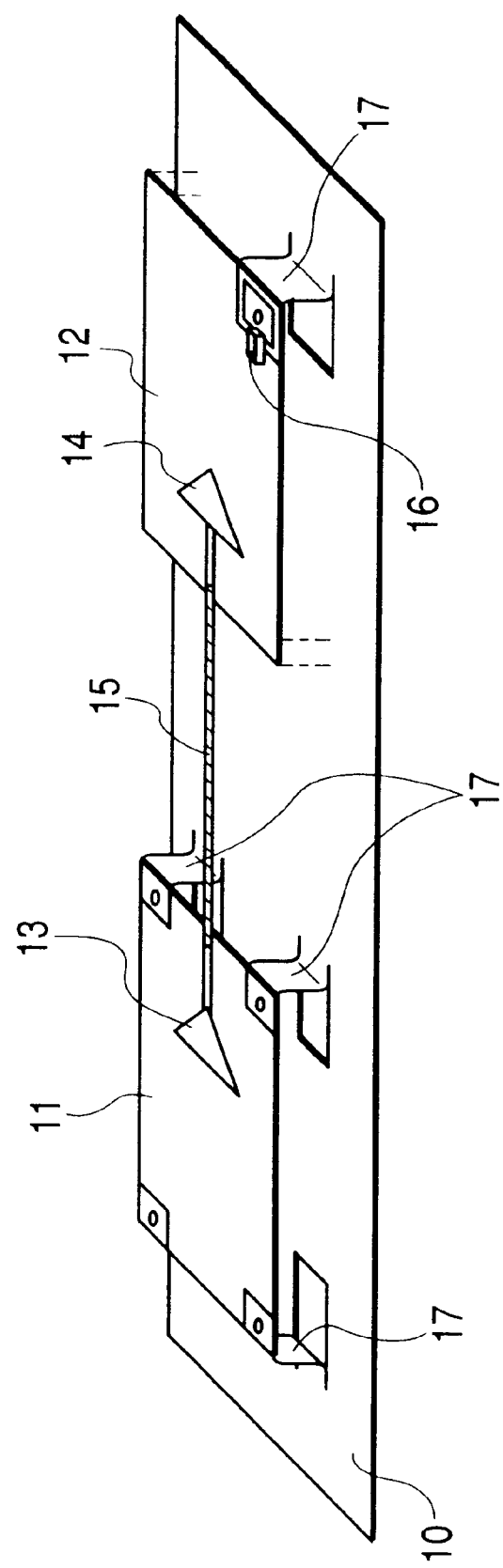
FIG. 1 is a schematic perspective view showing an electronic apparatus according to a first embodiment of the present invention.

A first embodiment of the present invention will be described in detail below by using accompanying drawings.

A noise radiation mechanism is considered first in an embodiment of the present invention such that print wiring plates are connected through a cable for a signal transmission.

Generally in the embodiment in which signals are transmitted between a signal transmitting print wiring plate and a signal receiving print wiring plate by means of a cable on a conductive device frame (ground), a radiated noise is generated by the cable and the signal receiving print wiring plate acting as antennas. In this condition, the problem of the noise radiation is often caused by current flowing through a ground conductive member (ground wire) rather than a radiation from a signal line of the cable and furthermore it often occurs structurally when a radiation from the cable is larger than a radiation from the print wiring plate.

Therefore, to decrease the radiated noise effectively, it is required to suppress current generated in the ground conductive member of this cable, namely, a standing wave.

As an effective method of suppressing a standing wave generated in a transmission line, it is known to ground an end of the transmission line with the same impedance characteristics as those of the transmission line. Therefore, to suppress the standing wave generated in the ground conductive member of the cable, the cable ground conductive member should be grounded to a conductive device frame by using an element having the same circuit parameters as the impedance characteristics between the cable ground conductive member and the conductive device frame (ground).

To ground it to the conductive device frame at the junction between the cable and the print wiring plate, however, a wiring material and a substrate pattern are required and therefore the grounding is often hard to be put into practice.

Accordingly in the present invention, there is provided an arrangement in which a portion between the ground conductive member of the print wiring plate connected to the cable ground and the conductive device frame is grounded at a single point by an impedance element having characteristics equivalent to the impedance characteristics between the cable ground conductive member and the conductive device frame (strictly speaking it is preferable to use an element having the same L, C, and R characteristics as those of the cable, but practically only resistance components described later are adequate).

This makes it possible to achieve the same effect as for impedance grounded at an end of the cable ground and some effect is obtained at either grounded position of the grounds of the print wiring plate, thus enabling a generation of the standing wave to be suppressed on the cable ground and reducing radiated noise.

A potential variation of the ground of the signal transmitting print wiring plate caused by an IC mounted on the print wiring plate causes a noise generation and therefore it is preferable to apply multi-point grounding by using a low-impedance member so as to prevent a potential variation as far as possible in the signal transmitting print wiring plate.

(First Embodiment)

Referring to FIG. 1, there is shown a schematic perspective view showing an electronic apparatus according to the first embodiment of the present invention. In FIG. 1, a signal transmitting driver print wiring plate 11 and a signal receiving receiver print wiring plate 12 are arranged in a conductive device frame (ground) 10.

The driver print wiring plate 11 has a ground layer, a signal layer, and a power supply layer as a print wiring pattern and the receiver print wiring plate 12 also has a ground layer, a signal layer, and a power supply layer as a print wiring pattern in the same manner.

Then, a driver IC 13 on the driver print wiring plate 11 is connected with a receiver IC 14 on the receiver print wiring plate 12 through a cable 15 for a signal transmission therebetween.

The cable 15 includes a signal line for a signal transmission between both ICs and a ground wire for connecting ground conductive members on both substrates with each other and comprises a coaxial cable.

The driver print wiring plate 11 is put on ground rising members 17 formed by cutting out the conductive device frame 10 and further held on the conductive device frame 10 by screwing down the ground rising members 17. With this screwing, the driver print wiring plate 11 is grounded to the conductive device frame 10 to such an extent that the potential variation on the ground conductive member of the driver print wiring plate 11 does not cause a problem.

The number of print wiring plate grounded portions on the driver print wiring plate 11 in the screwing is preferably one which suppresses the potential variation of the ground of the driver print wiring plate 11 caused by driving the driver 13; for example, the screwing is necessary at least in the four corners of the print wiring plate as shown in FIG. 1.

While the above grounding form on the driver print wiring plate 11 is not particular one, in this embodiment the receiver print wiring plate 12 is further grounded through an impedance element 16 to suppress a standing wave which may be generated on the ground conductive element (ground wire) of the cable 15.

This impedance element 16 has impedance characteristics equivalent to those of a circuit comprising the ground conductive member of the cable 15 and the conductive device frame 10.

The impedance characteristics can be obtained by appropriately combining L (inductance), C (capacitor), and R (resistance) elements on the basis of previously observed actual values, and the impedance element 16 can be formed by combining discrete elements having such characteristics or by arranging these elements on a substrate by means of a print wiring technology. Otherwise, more simply the impedance element 16 can be formed by using a resistance only as described later.

As set forth in the above, the standing wave generated on the ground conductive member of the cable 15 can be suppressed by conducting the ground rising member 17 to the signal receiving print wiring plate 12 through the impedance element 16 having the same circuit parameters as for the circuit comprising the ground conductive member of the cable 15 and the conductive device frame 10.

Impedance grounded with the impedance element 16 is adequately performed at a single location on the receiver print wiring plate 12. In this configuration, radiated noise reduction effect is not deteriorated by holding the receiver print wiring plate 12 with nonconductive members.

In addition there is no need for grounding to the conductive device frame at a junction between the cable 15 and the receiver print wiring plate 12, thereby enabling the configuration to be easily realized. The driver print wiring plate 11 is grounded at multiple points by using low-impedance members (the ground rising members 17), and therefore no potential variation occurs on the ground of the driver print wiring plate 11 and no noise radiation is caused by the driver print wiring plate 11.

Figure 2:
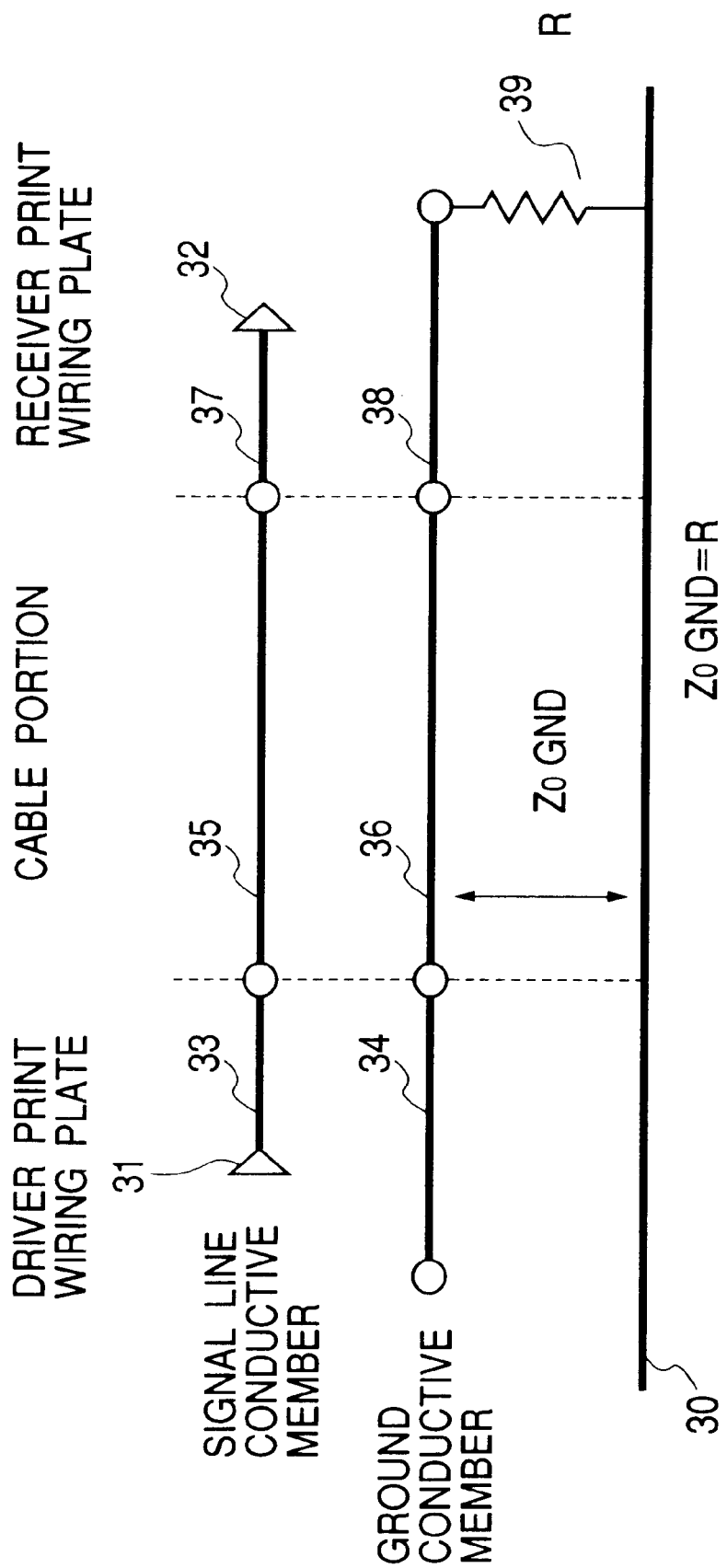
FIG. 2 is a diagram of an equivalent circuit of the electronic apparatus according to the first embodiment of the present invention.

Referring to FIG. 2, there is shown an equivalent circuit having a configuration in which a ground conductive member of the receiver print wiring plate is grounded to the device frame with a resistance having the same circuit parameters as for impedance characteristics between the frame and the cable ground line connecting substrates to be realized in the first embodiment of the present invention.

As shown in FIG. 2, in this embodiment the cable (corresponding to the cable 15 in FIG. 1) comprises a signal line conductive member 35 and a ground line 36 and connects a driver IC 31 (corresponding to 13 in FIG. 1) to a receiver IC 32 (corresponding to 14 in FIG. 1). Then, a receiver print wiring plate ground conductive member 38 is connected to a device frame 30 (corresponding to 20 in FIG. 1) through a resistance R (impedance) 39 having the same circuit parameters as impedance ($Z_{0GND}$) between the cable conductive member and the device frame 30. The standing wave generated on the ground conductive member of the cable can be suppressed in this manner.

In other words, according to this embodiment, the print wiring plate ground is grounded to the conductive device frame with a resistance having the same value as for the impedance characteristics when the ground conductive member of the cable for the electronic apparatus is considered as a signal line for the device frame, by which the standing wave generated on the ground conductive member of the cable can be suppressed and unnecessary noise radiation from the cable can be reduced significantly.

Figure 3:
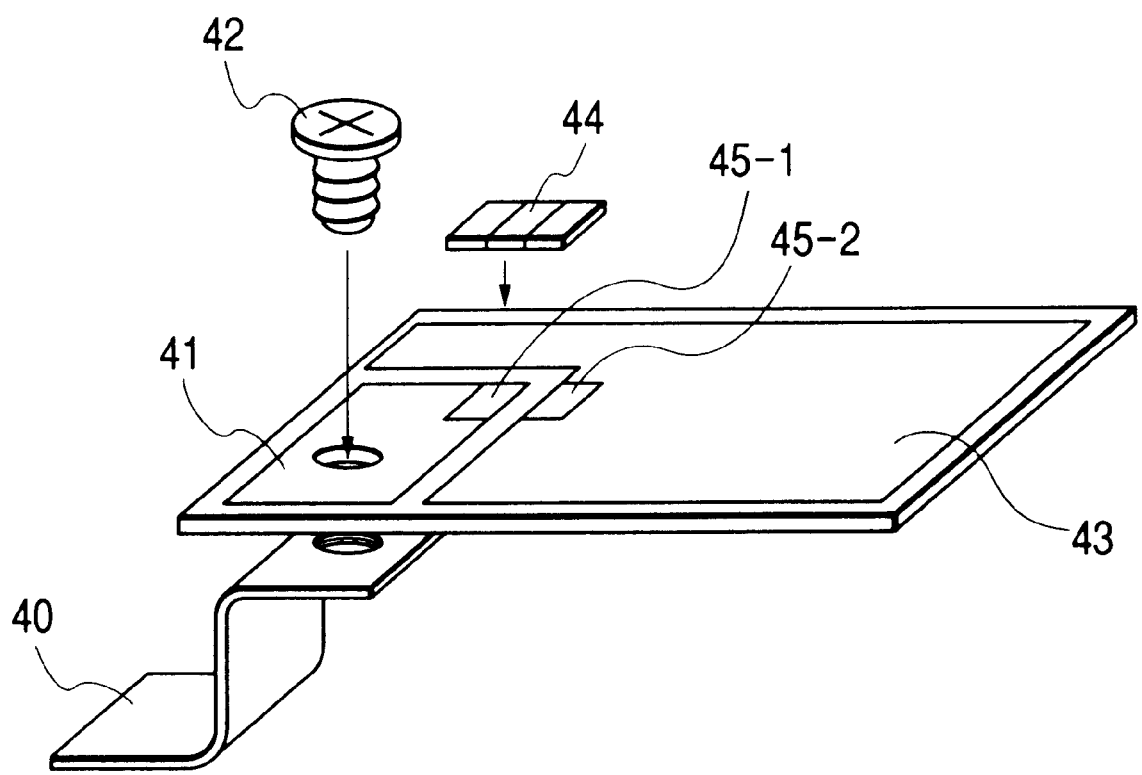
FIG. 3 is a schematic perspective view showing an example of a mounting structure in the electronic apparatus in FIG. 1.

Referring to FIG. 3, there is shown an example of a mounting structure around the receiver print wiring plate 12 in FIG. 1. In this configuration in FIG. 3, a rising portion 40 of the device frame is connected to a ground conductive member 43 in the main circuit portion of the print wiring plate (corresponding to the receiver print wiring plate 12 in FIG. 1) in a site portion of a conductive member 41 (conductive connection pad: Generally the pad can be formed in a photo-resist process together with other conductive portions) not connected to the ground conductive member 43.

In the site portion of the conductive member 41 fixed to the ground conductive member 43 of the substrate by using a screw 42, a land 45-1 and a land 45-2 are arranged and a chip resistance 44 (corresponding to the impedance element 16 in FIG. 1) is mounted between the land 45-1 and the land 45-2 by soldering or the like. The ground conductive member of the print wiring plate can be connected to the device frame through the chip resistance 44 in this manner.

As set forth in the above, the chip resistance having the same circuit parameters as for the impedance characteristics between the cable ground conductive member and the device frame is mounted with soldering, thereby easily realizing the same effect as for grounding the print wiring plate ground conductive member to the device frame with a resistance.

Figure 4:
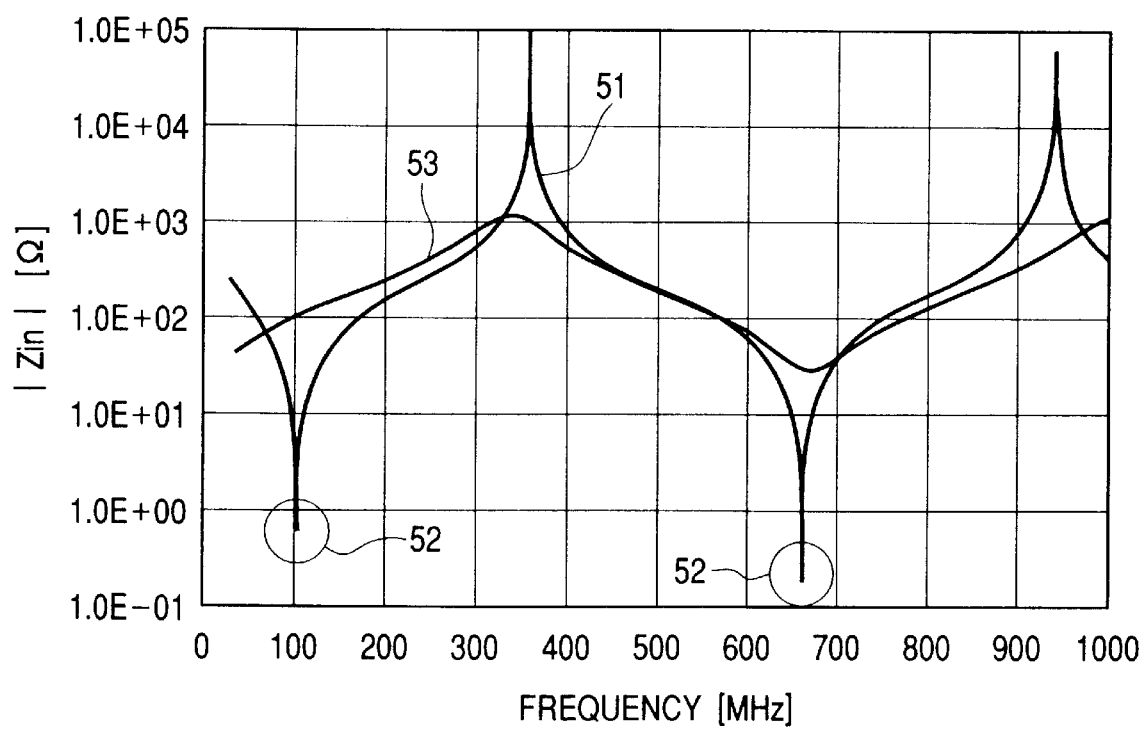
FIG. 4 is a graph showing a relationship between a frequency of a signal transmitted in the circuit in FIG. 2 and input impedance.

Referring to FIG. 4, there is shown a graph of a relationship between a frequency of a transmitted signal and an input impedance in the circuit shown in FIG. 2. This relationship has been deduced from a calculation regarding how input impedance ($Z_{in}$) of the cable ground conductive member 36 and the ground conductive member 38 of the receiver print wiring plate depends upon whether they are grounded with the resistance 39 having the same circuit parameters as for the impedance characteristics between the cable ground conductive member 36 and the device frame 30 on the basis of the connected position of the cable ground conductive member 36 of the driver print wiring plate 34 shown in FIG. 2.

As apparent from FIG. 4, very clear resonance 52 is observed in characteristics for nonresistance grounding indicated by a reference numeral 51. The impedance is extremely low of 1 Ωmax., from which it is expected that a sharp peak of a radiated noise will appear in this frequency.

To the contrary, when a grounding resistance is provided as indicated by a reference numeral 53 in this embodiment, any sharp resonance as described above does not appear in the impedance characteristics and the impedance is 10 Ωmin. at the lowest frequency, by which at least a decrease of 20 dB can be expected in an intensity of a resonance peak appearing in the radiated noise.

(Second Embodiment)

Figure 5:
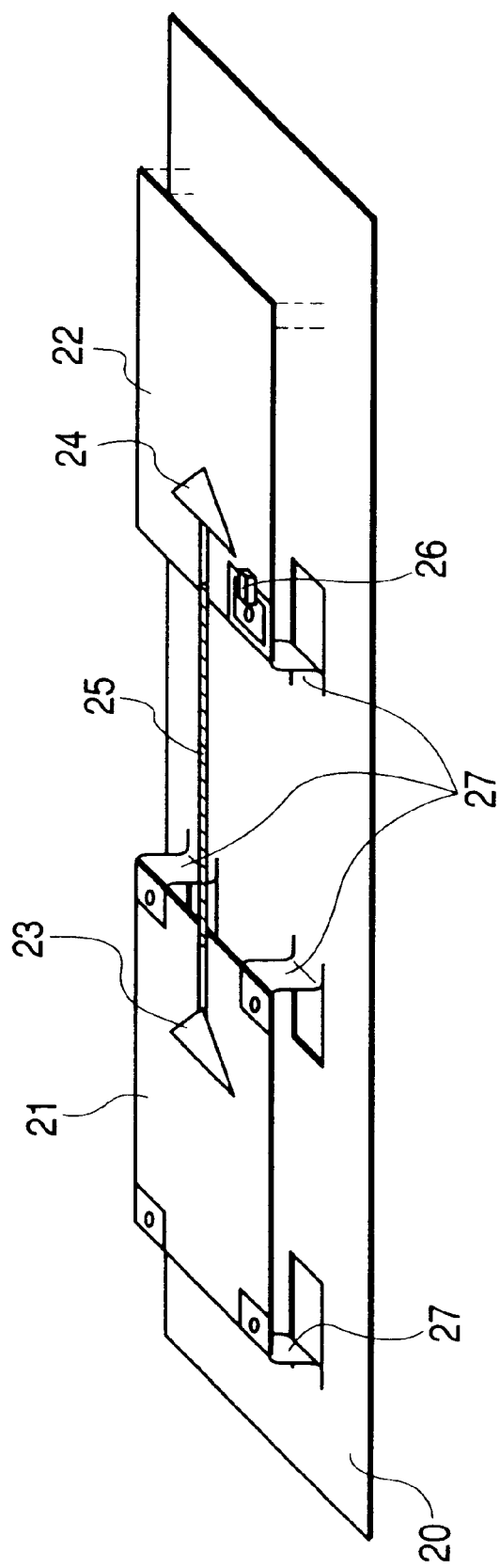
FIG. 5 is a schematic perspective view showing an electronic apparatus according to a second embodiment of the present invention.

Referring to FIG. 5, there is shown a schematic perspective view showing an electronic apparatus of a second embodiment according to the present invention. The configuration shown in FIG. 5 is basically almost the same as the configuration shown in FIG. 1, in which a driver IC 23 and a receiver IC 24 are mounted on a driver print wiring plate 21 and a receiver print wiring plate 22 on a conductive device frame 20 with a cable 25 connecting them.

In this embodiment, there is arranged a portion for connecting a ground conductive member of the receiver print wiring plate 22 to the conductive device frame 20 through an impedance element 26 in the vicinity of a connected portion between the cable 25 and the receiver print wiring plate 22. With this grounding through the impedance element 26 in the vicinity of the connected portion between the cable 25 which is a subject of discussion and the receiver print wiring plate 22, a higher effect of suppressing the standing wave is obtained.

As set forth in the above, according to the first embodiment of the present invention, there is provided an electronic apparatus in which a digital clock circuit is mounted and a signal transmitting print wiring plate and a signal receiving print wiring plate each having a ground conductive member are connected through a cable including a signal wire and a ground wire for a signal transmission and on a conductive device frame, having a configuration of grounding between an arbitrary single point on the ground conductive member of the signal receiving print wiring plate and the conductive device frame by using an impedance element having circuit parameters equivalent to impedance characteristics between the cable ground wire and the conductive device frame, and therefore the grounding is realized between the arbitrary single point on the ground conductive member of the signal receiving print wiring plate and the conductive device frame by using the impedance element having the circuit parameters equivalent to the impedance characteristics between the cable ground wire and the conductive device frame, thereby suppressing a generation of a standing wave on the cable ground conductive member and significantly reducing radiated noise very advantageously.

Next, a second embodiment of the present invention will be described in detail below by using drawings.

A noise radiation protection mechanism is considered first in this embodiment such that print wiring plates are connected through a cable for a signal transmission in this embodiment.

In this embodiment, a distance between a cable for connecting print wiring plates and a conductive frame is controlled in such a way that impedance characteristics between the ground of the print wiring plate and the conductive frame almost matches impedance characteristics between the cable ground and the conductive frame, thereby reducing a reflection which may occur in a junction between the ground of the print wiring plate and the cable ground and thus decreasing radiated noise caused by the reflection.

Generally, when transmission lines having impedance characteristics different from each other are connected, a part of an incident wave is reflected at a junction of the transmission lines. A reflectance Γ at this time is expressed by the following equation:

$$\Gamma = \frac{Z_1 - Z_2}{Z_1 + Z_2} \tag{1}$$

Γ: Reflectance at junction between conductive member 1 and conductive member 2
$Z_1$: Impedance of conductive member 1
$Z_2$: Impedance of conductive member 2

The equation (1) represents a relationship between the reflectance Γ of current flowing from the conductive member 1 to the conductive member 2 at a junction between a signal line 1 having impedance characteristics $Z_1$ and a signal line 2 having impedance characteristics $Z_2$ and the impedance characteristics. The reflected wave generated at the junction of the transmission lines is synthesized with the incident wave to become a standing wave, thus causing a radiated noise.

Therefore, the components are arranged so that the reflectance is zero, in other words, $Z_1$ equals to $Z_2$ in the equation (1), by which the radiated noise caused by the signal reflection can be reduced.

Generally, the impedance characteristics of the ground conductive member of the print wiring plate and the ground conductive member of the cable depend upon a positional relationship between each conductive member and the conductive frame. Therefore, in the present invention, the impedance characteristics are adjusted by changing the relationship between one or both of the ground conductive member of the print wiring plate and the ground conductive member of the cable and the conductive frame so as to reduce the radiated noise caused by the signal reflection.

A concrete sample configuration according to the second embodiment will be described in detail below by referring to accompanying drawings.

(Third Embodiment)

Figure 6:
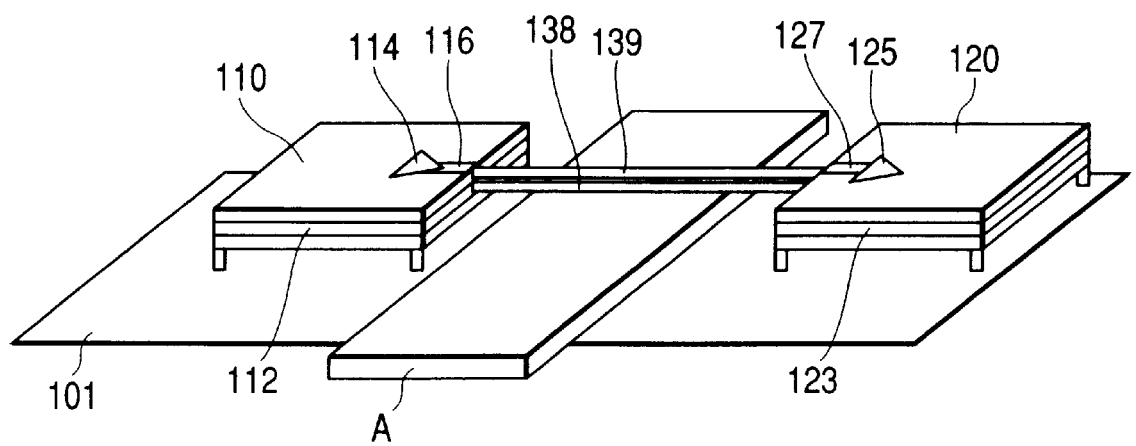
FIG. 6 is a schematic perspective view showing an electronic apparatus according to a third embodiment of the present invention.

Referring to FIG. 6, there is shown a schematic perspective view showing an electronic apparatus according to a third embodiment of the present invention. In the electronic apparatus shown in FIG. 6, a signal transmitting print wiring plate 110 and a signal receiving print wiring plate 120 are arranged with an appropriate spacer therebetween on a frame 101 comprising a conductive member and with a cable (a ground conductive member 138, a signal conductive member 139) connecting them for a signal transmission.

A ground conductive member 112 of the signal transmitting print wiring plate 110 and a ground conductive member 123 of the signal receiving print wiring plate 120 are only needed to be arranged with an appropriate spacer (it should be made of an insulating material) for the wiring plates therebetween on a surface or a layer and the ground conductive member 138 of the cable is used for connecting the ground conductive members of both of the wiring plates with each other. The cable (the ground conductive member 138, the signal conductive member 139) is assumed here to be a pair cable.

In this embodiment, a high dielectric constant member A is inserted between the cable (the ground conductive member 138, the signal conductive member 139) and the frame in order to match impedance between the ground conductive member 112 of the signal transmitting print wiring plate 110, the ground conductive member 138 of the cable, or the ground conductive member 123 of the signal receiving print wiring plate 120 and the frame 101 made of a conductive member.

Assuming that $Z_{0PCB1GND}$, $Z_{0CableGND}$, and $Z_{0PCB2GND}$ designate each impedance between the ground conductive member 112 of the signal transmitting print wiring plate 110, the ground conductive member 138 of the cable, or the ground conductive member 123 of the signal receiving print wiring plate 120 and the frame 101 made of a conductive member, the values of the impedance $Z_{0PCB1GND}$, $Z_{0CableGND}$, and $Z_{0PCB2GND}$ can be expressed by the following equation (2) by inserting the high dielectric constant member A between the cable and the frame in this embodiment:

$$Z_{0PCB1GND} = Z_{0CableGND} = Z_{0PCB2GND} \qquad (2)$$

$Z_{0PCB1GND}$: Impedance of ground conductive member of signal transmitting print wiring plate $Z_{0CableGND}$: Impedance of ground conductive member of print wiring plate $Z_{0PCB2GND}$: Impedance of ground conductive member of signal receiving print wiring plate The above equation (2) represents that the impedance characteristics are equivalent among the ground conductive member of the signal transmitting print wiring plate, the ground conductive member of the cable, and the ground conductive member of the signal receiving print wiring plate.

This makes it possible to reduce a reflection at each junction of the ground conductive member 112 of the signal transmitting print wiring plate 110, the ground conductive member 138 of the cable, and the ground conductive member 123 of the signal receiving print wiring plate 120 and to decrease the radiated noise caused by the reflection.

Generally, impedance $Z_0$ of the conductive member can be expressed by the following equation (3) using a permeability $\mu$ and a dielectric constant $\in$:

$$Z_o = \sqrt{\frac{\mu}{\varepsilon}} \qquad (3)$$

$Z_0$: Impedance
$\mu$: Permeability
$\in$: Dielectric constant

In addition, generally the ground conductive member of the cable is long and thin and therefore its impedance is higher than impedance between the ground conductive member of the print wiring plate and the frame.

Accordingly by arranging the high dielectric constant member A in the vicinity of the cable ground to increase $\in$ in the equation (3), the impedance characteristics $Z_{0PCB1GND}$ between the cable ground conductive member 138 and the frame 101 can be reduced and therefore the impedance characteristics close to the above equation (2) is realized, thereby enabling a decrease of the radiated noise caused by the signal reflection.

As set forth in the above, in this embodiment the high dielectric constant member A is inserted to decrease the impedance of the ground conductive member 138 portion of the cable for balancing with the impedance of the transmitting and receiving wiring plates 110 and 120, thereby resolving their unbalance, suppressing a signal reflection at junctions between the ground conductive member 138 of the cable and the ground conductive member 112 or 123 of the transmitting or receiving wiring plates 110 or 120, and decreasing the radiated noise caused by the reflection.

For the high dielectric constant member A, it is possible to use a member in a form of a sheet or a block having an appropriate size according to a material among various types of materials generally used as a dielectric material for a capacitor.

(Fourth Embodiment)

Figure 7:
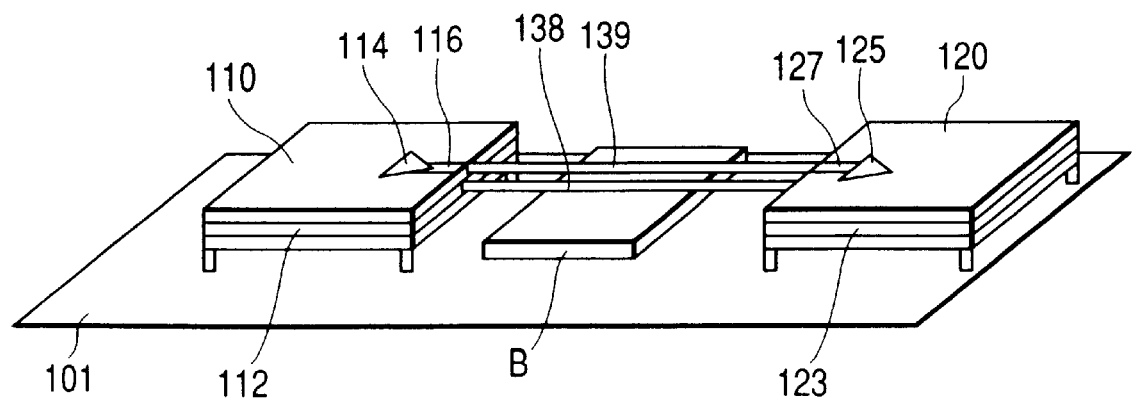
FIG. 7 is a schematic perspective view showing an electronic apparatus according to a fourth embodiment of the present invention.

Referring to FIG. 7, there is shown a schematic perspective view showing an electronic apparatus according to a fourth embodiment of the present invention. A configuration in FIG. 7 is also intended for a signal transmission by connecting a signal transmitting print wiring plate 110 to a signal receiving print wiring plate 120 through a cable (a ground conductive member 138, a signal conductive member 139) almost in the same manner as the configuration in FIG. 6.

FIG. 7 shows a sample configuration for such a case that a large high dielectric constant member as shown in FIG. 6 cannot be arranged due to a space for arrangement of other components (not shown) on a frame 101. In this embodiment, it is assumed that a small-sized high dielectric constant member B is forcibly used since there is an enough space for normally arranging a high dielectric constant member between the ground conductive member of the cable and the frame.

Therefore, in this embodiment the cable ground conductive member 138 is made thick, for example, it is made as thicker as possible than the signal conductive member 139 so as to decrease the impedance $Z_{0CableGND}$ between the cable ground conductive member 138 and the frame 101. This makes it possible to realize the condition represented by the equation (2).

In this manner, even if a large-sized high dielectric constant member as shown in FIG. 6 cannot be arranged due to a space for arrangement of other components (not shown), the impedance $Z_{0CableGND}$ between the cable ground conductive member 138 and the frame 101 can be decreased by adjusting the thickness of the cable ground conductive member 138 to be balanced with the impedance of the transmitting and receiving wiring plates 110 and 120 for resolving the unbalance, thereby suppressing a signal reflection at junctions between the cable ground conductive member 138 and the ground conductive member 112 or 123 of the transmitting or receiving wiring plate 110 and 120 and reducing the radiated noise caused by this reflection.

(Fifth Embodiment)

Figure 8:
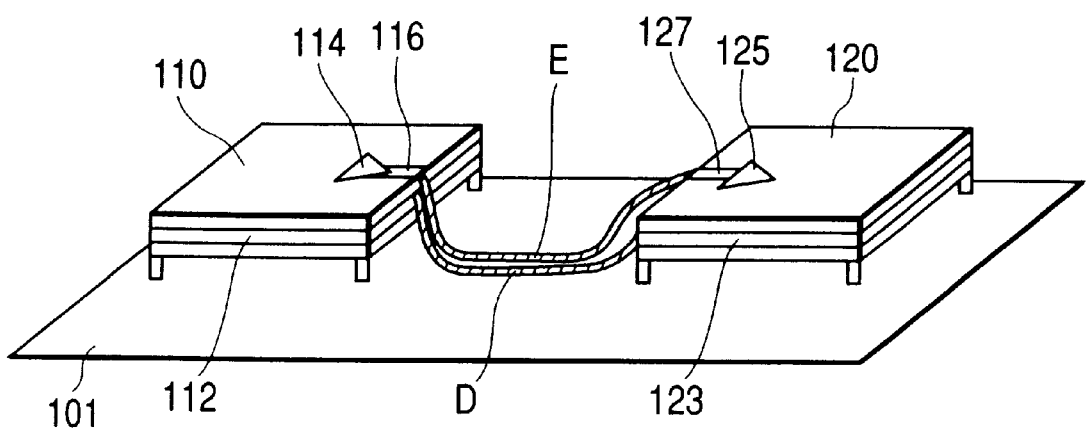
FIG. 8 is a schematic perspective view showing an electronic apparatus according to a fifth embodiment of the present invention.

Referring to FIG. 8, there is shown a schematic perspective view showing an electronic apparatus according to a fifth embodiment of the present invention. The configuration shown in FIG. 8 is also intended for a signal transmission by connecting a signal transmitting print wiring plate 110 to a signal receiving print wiring plate 120 through a cable (a ground conductive member 138, a signal conductive member 139) almost in the same manner as the configurations in FIG. 6 and FIG. 7.

In this embodiment, the cable ground conductive member 138 and the cable signal conductive member 139 are brought near a frame made of a conductive member 101 so as to obtain the condition represented by the equation (2) like the third embodiment.

As described in the fourth embodiment, the impedance of the cable ground conductive member is higher than the print wiring plate ground conductive member if a distance from the frame 101 made of the conductive member is equal. At this point, a relationship between the distance of the wire from the conductive frame and the impedance characteristics can be expressed by the following equation (4) approximately:

$$Z_o = \frac{276}{\sqrt{\varepsilon}} \log \frac{d}{2a} \quad (4)$$

$Z_0$: Impedance
∈: Dielectric constant
d: Distance from cable to frame
a: Radius of cable The equation (4) represents a relationship between a height d, a radius a of a conductor wire, and impedance characteristics when there is the conductor wire having a radius a at the height d arranged parallel with an ideal ground.

Therefore, by winding the ground conductive member D of the cable as shown so as to decrease the distance from the frame 101 made of the conductive member to the cable ground conductive member D, the impedance $Z_0$ can be decreased and therefore the condition of the equation (2) is obtained.

As set forth in the above, in this embodiment the ground conductive member of the cable is brought to wind so as to decrease the distance from the frame 101 made of the conductive member to the cable ground conductive member D, by which the impedance $Z_{0CableGND}$ between the cable ground conductive member 138 and the frame 101 is decreased to be balanced with the impedance of the transmitting and receiving wiring plates 110 and 120, thereby resolving the unbalance, suppressing a signal reflection at junctions between the cable ground conductive member 138 and the ground conductive member 112 or 123 of the transmitting and receiving wiring plate 110 or 120, and reducing the radiated noise caused by the reflection.

(Sixth Embodiment)

Figure 9:
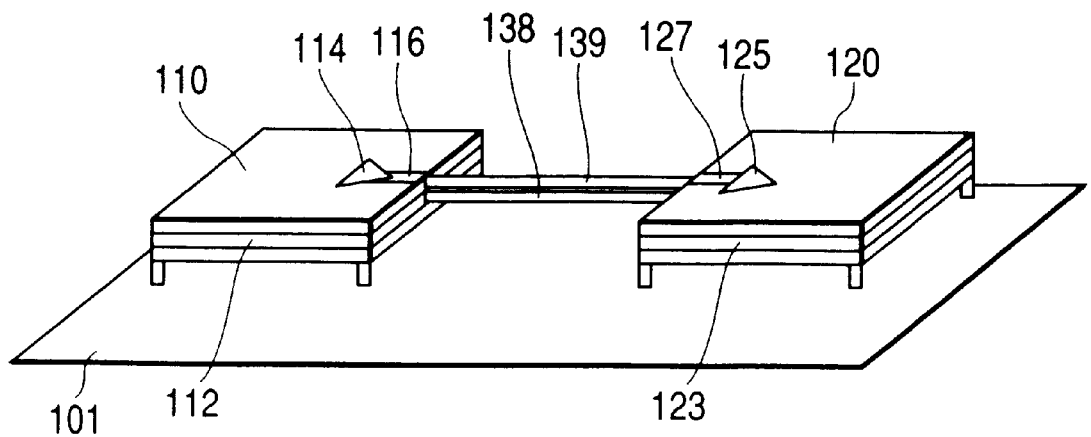
FIG. 9 is a schematic perspective view showing an electronic apparatus according to a sixth embodiment of the present invention.

Referring to FIG. 9, there is shown a schematic perspective view showing an electronic apparatus according to a sixth embodiment of the present invention. The configuration shown in FIG. 9 is also intended for a signal transmission by connecting a signal transmitting print wiring plate 110 to a signal receiving print wiring plate 120 through a cable (a ground conductive member 138, a signal conductive member 139) almost in the same manner as the configurations in FIG. 6, FIG. 7, and FIG. 8.

This embodiment is designed not only in order to realize the condition of the equation (2) as described in the third embodiment, but to prevent a disorder of a signal waveform of a signal passing through a signal conductive member 116 on the signal transmitting print wiring plate 110, a cable signal conductive member 139, or a signal conductive member 127 on the signal receiving print wiring plate 120.

In other words, in this embodiment the electronic apparatus is configured so as to satisfy the following equation (5) by adjusting widths of the signal conductive members on the print wiring plates where $Z_{0PCB1Sig}$, $Z_{0CableSig}$, and $Z_{0PCB2Sig}$ are impedance characteristics of the signal conductive member 116 on the signal transmitting print wiring plate 110, the signal conductive member 139 of the cable, and the signal conductive member 127 on the signal receiving print wiring plate 120:

$$Z_{0PCB1Sig} = Z_{0CableSig} = Z_{0PCB2Sig} \quad (5)$$

$Z_{0PCB1Sig}$: Impedance of signal conductive member of signal transmitting print wiring plate
$Z_{0CableSig}$: Impedance of signal conductive member of print wiring plate
$Z_{0PCB2Sig}$: Impedance of signal conductive member of signal receiving print wiring plate As set forth in the above, in this embodiment an adjustment is made for decreasing the unbalance of impedance not only in the ground conductive member, but also in the signal conductive members, namely, the signal conductive member of the cable and the signal conductive members of the wiring plates, thereby suppressing a signal reflection at junctions between the cable and the signal conductive member 116 or 127 of the transmitting or receiving wiring plate 110 or 120 or the ground conductive member 112 or 123 thereof and reducing the radiated noise caused by the reflection.

(Seventh Embodiment)

Figure 10:
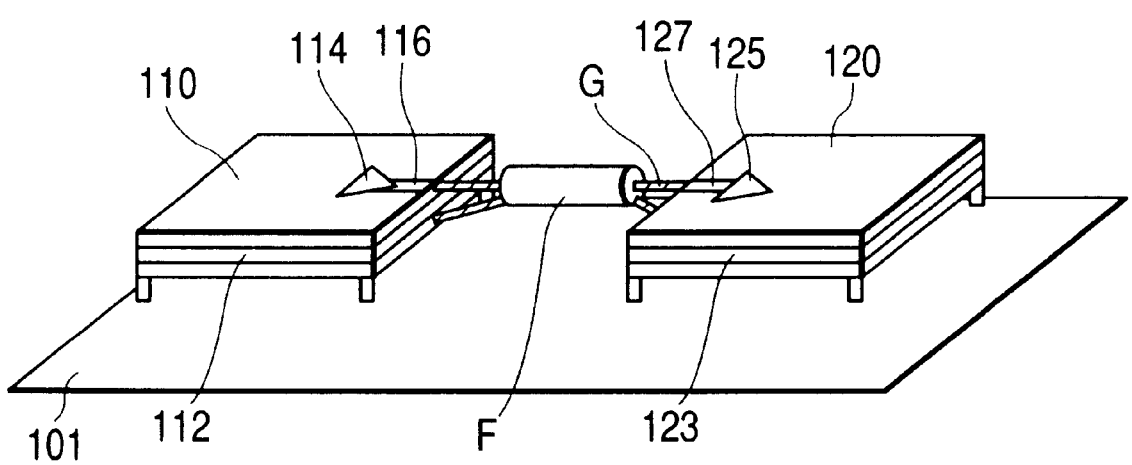
FIG. 10 is a schematic perspective view showing an electronic apparatus according to a seventh embodiment of the present invention.

Referring to FIG. 10, there is shown a schematic perspective view showing an electronic apparatus according to a seventh embodiment of the present invention. The configuration shown in FIG. 10 is also intended for a signal transmission by connecting a signal transmitting print wiring plate 110 to a signal receiving print wiring plate 120 through a cable (a ground conductive member 138, a signal conductive member 139) almost in the same manner as the configurations in FIG. 6 to FIG. 9.

Although the configuration described in the above fifth embodiment is such that the cable is brought near the frame made of the conductive member in order to match the impedance characteristics of the ground conductive member with those of the wiring plates by using the cable, the impedance of the cable signal conductive member 139 is also decreased when using a pair cable in this configuration.

Therefore in this embodiment, a coaxial cable comprising a signal conductive member G and a ground conductive member F is used and the cable is brought near a frame 101 made of a conductive member, thereby decreasing the impedance characteristics of the jacketed ground conductive member F of the coaxial cable.

In this embodiment, the impedance of the signal conductive member G of the coaxial cable is determined by the jacketed ground conductive member F of the coaxial cable enclosing it and therefore the impedance does not change, thereby avoiding a problem of impedance of the cable signal conductive member 139 affected as described in the fifth embodiment.

As set forth in the above, according to this embodiment of the present invention there is provided the electronic apparatus on which the digital clock circuit is mounted and in which the signal transmitting print wiring plate and the signal receiving print wiring plate each having the signal conductive member and the ground conductive member are connected on the conductive device frame through the cable including the signal conductive member and the ground conductive member for a signal transmission, wherein impedance of the signal conductive member and the ground conductive member of the cable determined by a correlation with the conductive device frame is balanced with the cable-side impedance of the signal conductive member and the ground conductive member of the signal receiving print wiring plate determined by a correlation with the conductive device frame. This makes it possible to suppress a signal reflection at junctions between the signal conductive member and the ground conductive member of the cable and the signal conductive member and the ground conductive member of the signal transmitting print wiring plate or the signal receiving print wiring plate and to reduce the radiated noise caused by the signal reflection.

What is claimed is:

1. An electronic apparatus comprising:
   a conductive device frame;
   a signal transmitting print wiring plate arranged on said conductive device frame, incorporating a digital clock circuit and having a ground conductive member, said ground conductive member being electrically connected at multi-points to said conductive device frame through low-impedance members;
   a signal receiving print wiring plate arranged on said conductive device frame, incorporating a digital clock circuit and having a ground conductive member;
   a cable including a signal wire and a ground wire for a signal transmission and electrically connecting said signal transmitting print wiring plate to said signal receiving print wiring plate on said conductive device frame; and
   an impedance element electrically connecting an arbitrary single point on the ground conductive member of said signal receiving print wiring plate to said conductive frame,
   wherein said impedance element has circuit parameters equivalent to impedance characteristics between said cable ground wire and said conductive device frame.

2. An electronic apparatus according to claim 1, wherein said cable comprises a coaxial cable.

3. An electronic apparatus according to claim 1, wherein the point on the ground conductive member of said signal receiving print wiring plate connected to the conductive device frame by said impedance element is located in the vicinity of the junction between said receiving print wiring plate and said cable.

4. An electronic apparatus according to claim 1, wherein said low-impedance members are low-impedance elements.

* * * * *

UNITED STATES PATENT AND TRADEMARK OFFICE
CERTIFICATE OF CORRECTION

PATENT NO. : 6,573,804 B2  
DATED : June 3, 2003  
INVENTOR(S) : Seiji Hayashi

It is certified that error appears in the above-identified patent and that said Letters Patent is hereby corrected as shown below:

Title page,
Item [56], FOREIGN PATENT DOCUMENTS,
"411259172" should read -- 11-259172 --.

Column 2,
Line 58, "related" should read -- related to --.

Column 10,
Line 53, "plate" should read -- plates --.

Column 11,
Line 42, "plate" should read -- plates --.

Signed and Sealed this

Ninth Day of December, 2003

JAMES E. ROGAN
*Director of the United States Patent and Trademark Office*